United States Patent [19]
Tomomura et al.

[11] Patent Number: 5,103,269
[45] Date of Patent: Apr. 7, 1992

[54] ELECTROLUMINESCENT DEVICE OF COMPOUND SEMICONDUCTOR COMPRISING ZNS OR ZNS AND ZNSE

[75] Inventors: Yoshitaka Tomomura; Masahiko Kitagawa; Kenji Nakanishi, all of Nara, Japan

[73] Assignee: Sharp Kabushiki Kaisha, Japan

[21] Appl. No.: 549,317

[22] Filed: Jul. 9, 1990

[30] Foreign Application Priority Data

Jul. 10, 1989 [JP] Japan .................. 1-178468

[51] Int. Cl.$^5$ .................. H01L 33/00; H01L 29/22
[52] U.S. Cl. .................. 357/17; 357/61
[58] Field of Search .................. 357/17, 16, 61, 30 B, 357/30 E

[56] References Cited

U.S. PATENT DOCUMENTS

| | | | |
|---|---|---|---|
| 4,868,615 | 9/1989 | Kanata | 357/17 |
| 4,916,496 | 4/1990 | Tomomura et al. | 357/17 |
| 4,955,031 | 9/1990 | Jain | 357/17 |
| 5,008,891 | 4/1991 | Morita | 357/17 |
| 5,045,897 | 9/1991 | Ahlgren | 357/17 |

FOREIGN PATENT DOCUMENTS

| | | | |
|---|---|---|---|
| 0351867 | 1/1990 | European Pat. Off. | 357/17 |
| 0351869 | 1/1990 | European Pat. Off. | 357/17 |
| 61-26271 | 2/1986 | Japan | 357/17 |
| 62-211971 | 9/1987 | Japan | 357/17 |
| 62-296484 | 12/1987 | Japan | 357/17 |
| 63-240084 | 10/1988 | Japan | 357/17 |
| 63-255976 | 10/1988 | Japan | 357/17 |

Primary Examiner—Rolf Hille
Assistant Examiner—S. V. Clark
Attorney, Agent, or Firm—Nixon & Vanderhye

[57] ABSTRACT

An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer.

11 Claims, 1 Drawing Sheet

ELECTROLUMINESCENT DEVICE OF COMPOUND SEMICONDUCTOR COMPRISING ZNS OR ZNS AND ZNSE

BACKGROUND OF THE INVENTION

1. Field of the Invention

This invention relates to an electroluminescent device of compound semiconductor. More particularly, it is concerned with an electroluminescent device of compound semiconductor in which a compound semiconductor selected from zinc sulfide (ZnS), zinc selenide (ZnSe) and a mixed crystal thereof is used.

2. Description of the Prior Art

ZnS and ZnSe are known as a material for a blue light-emitting diode and other various electroluminescent devices of producing lights falling within the range of from ultraviolet rays to all visible rays. FIG. 4 and FIG. 5 each shows a basic construction of the conventional blue light-emitting diode manufactured from the material. Precisely, FIG. 4 is a cross sectional view of a metal-insulator-semiconductor (MIS) type electroluminescent device using ZnS as a light-emitting layer, where 31 is a low-resistivity n-type ZnS substrate, 32 is a ZnS insulating layer for hole injection, which is made of a high-resistivity ZnS, and 33 and 34 each is a metal electrode as formed on the low-resistance n-type ZnS substrate 31 and one as formed on the ZnS insulation layer 32, respectively. The substrate 31 is an n-type ZnS single crystal substrate having an resistivity of from 1 to 10 $\Omega$cm, which is prepared by heat-treating a ZnS bulk single crystal as grown by an iodine transport method using iodine as a transporting medium, in a molten zinc of 1000° C. for 100 hours or more so as to lower the resistivity of the resulting crystal substrate.

The ZnS insulation layer 32 is epitaxially grown on the ZnS substrate 31 by organometallic vapor phase epitaxy (OMVPE); Au is plated over the ZnS insulation layer 32 by vacuum deposition to form the positive electrode 34; and an In-Hg amalgam is coated on the back surface of the n-type ZnS substrate 31 followed by heat-treatment in a pure hydrogen for a period of from several tens of seconds to several minutes to form the ohmic negative electrode 33. Accordingly, the conventional ZnS MIS-type blue light-emitting device is constructed (K. Hirahara et al., Extended Abstracts of the 15th conf. on SSDM, Tokyo, 1983).

FIG. 5 is a cross sectional view of a p-n junction-type blue light-emitting device of ZnSe, in which 41 is a low-resistance p-type GaAs substrate, 42 is a light-emitting layer made of a p-type ZnSe, 43 is a light-emitting layer made of an n-type ZnSe, and 44 and 45 each is a metal electrode as formed on the p-type GaAS substrate 41 and one as formed on the n-type ZnSe light-emitting layer 43. The two epitaxial layers 42 and 43 as formed on the GaAs substrate 41 are formed by OMVPE like the case of the above-mentioned ZnS MIS-type electroluminescent device. As electrodes for applying voltage, a negative electrode 45 made of In is formed on the n-type ZnSe light-emitting layer 43 and a positive electrode 44 made of In is on the back surface of the p-type GaAs substrate 41. Accordingly, the conventional ZnSe p-n junction-type blue light-emitting electroluminescent device is constructed (T. Yasuda et al., "Metalorganic Vapor Phase Epitaxy of Low-Resistivity p-Type ZnSe", Appl. Phys. Lett., 52 (1988), pp. 57 to 58; K. Akimoto et al., "Electroluminescnece in an Oxygen-Doped ZeSe p-n Junction grown by Molecular Beam Epitaxy", Japanese Journal of Akimoto et al., "Electroluminescence from a ZnSe p-n Junction Fabricated by Nitrogen-Ion Implantation", ditto, pp. L528 to 530).

In the above-mentioned ZnS MIS-type blue light-emitting electroluminescent device (FIG. 4), a tabular bulk single crystal is used as the light-emitting layer since a high-quality ZnS epitaxial film is difficult to obtain. In such constitution, however, it is extremely difficult to control the light-emitting characteristic by lowering the resistivity of the layer by the heat-treatment. Moreover, as the device has MIS constitution, the current-injecting efficiency is low and, as a result, it is extremely difficult to attain light-emission with high efficiency and high luminance. Furthermore, there is an additional problem that the light-emitting spectrum is broad with an inferior monochromaticity, since the light-emission system of the device is one for giving a blue color by emission from a deep level.

On the other hand, in the p-n junction-type electroluminescent device of FIG. 5, light-emission near the band edge is utilized for emitting blue light. Therefore, the light-emitting spectrum is sharp with an excellent monochromaticity. Moreover, as the device has p-n junction structure, the current-injection efficiency may be elevated. However, as the device uses a III-V compound semiconductor substrate such as GaAs or GaP substrate or uses an Si substrate, it is difficult to obtain a ZnSe epitaxial layer having a crystallinity necessary as a light-emitting material because of the lattice mismatch between ZnSe forming the light-emitting layer and the substrate and because of the mismatch of the thermal expansion coefficient therebetween. Moreover, since the substrate-constituting elements would diffuse into the ZnSe epitaxial film by thermal diffusion, it is not easy to control the impurities in the light-emitting layer. Therefore, there is a severe problem that formation of a high-quality ZnSe light-emitting layer necessary for obtaining a high-efficiency light-emission is extremely difficult. Additionally, there is another problem in that elevation of the efficiency of taking out the emitted blue light is difficult since all of GaAs, GaP and Si to be employed as the substrate material have a property of absorbing the blue light as emitted from the light-emitting layer.

SUMMARY OF THE INVENTION

This invention has been made to overcome the drawbacks which have hereinabove been pointed out, and the object thereof is to provide a high-efficiency and high-luminance blue light-emitting electroluminescent device of compound semiconductor.

The inventors have studied for the purpose of forming a p-n junction-type epitaxial layer of ZnSe displaying high efficiency and high luminance, taking account of the facts that (1) it is necessary to form a highly crystalline p-n junction-type epitaxial layer on a substrate of a single crystal having a composition which is the same as or extremely similar to the composition of th p-n junction-type epitaxial layer and (2) it is also necessary to employ a substrate having a composition which is different from the composition of the p-n junction-type epitaxial layer and which has a larger forbidden band gap than that of the latter so that the light as emitted by the p-n junction-type epitaxial layer is not absorbed by the substrate. As a result, the inventors have found that (1) an electroluminescent device as manufactured by forming an epitaxial interlayer composed of ZnS and ZnSe between the ZnS single crystal substrate and the ZnSe p-n junction-type epitaxial layer, the interlayer having a graditional composition which is similar to the composition of the substrate at the substrate side thereof and to that of the epitaxial layer at the layer side thereof, has a high crystallinity in the ZnSe p-n junction-type epitaxial layer and that (2) the blue light to be emitted by the ZnSe p-n junction-type epitaxial layer by imparting voltage thereto is almost not absorbed by the ZnS substrate and the above-mentioned ZnS/ZnSe epitaxial interlayer. On the basis of such finding, they have achieved the present invention.

According to the invention, there is provided an electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer.

DETAILED DESCRIPTION OF THE PREFERRED EMBODIMENTS

Figure 4:
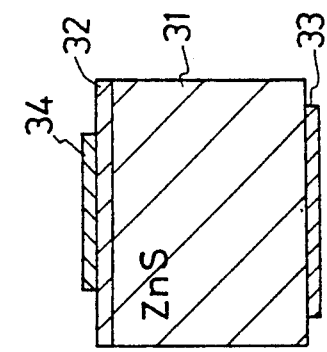
FIG. 4 and FIG. 5 are views each showing a construction of the conventional electroluminescent device.

The single crystal substrate made of ZnS or a mixed crystal of ZnS and ZnSe which is employed in the present invention is one on which the above-mentioned p-n junction-type epitaxial layer having a light-emitting function with high efficiency and high luminance is formed. Accordingly, the substrate is preferred to be such that it has a high crystallinity and does not absorb the light to be emitted from the p-n junction-type epitaxial layer. Desirably, the substrate is one having a larger forbidden band gap than the forbidden band gap of the above mentioned p-n junction-type epitaxial layer.

It is preferred that the composition of the single crystal of the substrate has a higher S content than the mixed crystal of ZnS and ZnSe to be in the p-n junctiontype epitaxial layer, which will be explained in detail hereinafter, since the single crystal having such a composition does not absorb the emitted light, when it is formed into an electroluminescent device. In general, therefore, the single crystal to be the substrate suitably contains from 30 to 100 atm. % of S with S plus Se being 100 atm. %, or contains from 0 (zero) to 70 atm. % of Se. As the substrate can be used a single crystal substrate made of ZnS or a mixed crystal of ZnS and ZnSe as grown by halogen chemical transport method, sublimation method or high pressure melting method. Above all, a ZnS bulk single crystal as grown by halogen chemical transport method using iodine as a transport medium is especially preferred as the substrate, as it has a low dislocation density (etch pit density of $10^4$ cm$^{-2}$ or less) and it is colorless and transparent and has a high transmittance to an emitted blue light of 90% or more. Using it as the substrate, therefore, it is advantageously possible to efficiently take out the light as emitted from the light-emitting part to the outside of the device.

The p-n junction-type epitaxial layer to be provided over the said substrate is one which emits a monochromatic blue light by application of voltage thereto, and the blue light as emitted from the layer is preferably not absorbed by the above-mentioned substrate. The p-n junction-type epitaxial layer is made of ZnSe or a mixed crystal comprising ZnS and ZnSe. The latter mixed crystal of ZnS and ZnSe is desired to have a lower S-content than that in the mixed crystal of ZnS and ZnSe to form the above-mentioned substrate, since absorption of the emitted blue light by the substrate may be inhibited more and the device is to have a higher luminance. In general, it is suitable that the S-content in the mixed crystal of ZnS and ZnSe of forming the epitaxial layer is from 0 (zero) to 20 atm. % based on the total of S plus Se of being 100 atm. %.

As impurities which may be added to the above-mentioned p-n junction-type epitaxial layer, there are Al and other III-Group elements (such as Al, In, Ga, Tl) as well as Cl and other VII-Group elements (such as I, Cl, Br) for n-type, and Li and other Ia- and Ib-Group elements (such as Li, Na, K, Cu, Ag, Au) as well as N and other V-Group elements (such as N, A, P) for p-type. The concentration of the impurities may be generally from $10^{15}$ to $10^{18}$ cm$^{-3}$ for n-type and from $10^{15}$ to $10^{17}$ cm$^{-3}$ for p-type. The p-n junction-type epitaxial layer may be formed, in general, by laminating an n-type epitaxial layer having a thickness of from 0.5 to 2 microns and a p-type epitaxial layer having a thickness of from 0.2 to 2 microns. The respective epitaxial layers may be formed by any epitaxial growth method which is known in this technical field.

In accordance with the present invention, an epitaxial interlayer which is composed of ZnS and ZnSe and which has a function of relaxing lattice strain is provided between the above-mentioned single crystal substrate and the above-mentioned p-n junction-type epitaxial layer.

The said ZnS-ZnSe epitaxial interlayer is a ground layer which is provided for the purpose of forming the above-mentioned p-n junction-type epitaxial layer with a high crystallinity over the said ground layer, and it is to relax the lattice strain to be caused by the lattice inconformity between the above-mentioned single crystal substrate and the above-mentioned p-n junction-type epitaxial layer as well as by the difference of the thermal expansion coefficient therebetween. The ZnS-ZnSe epitaxial interlayer may be composed of a composition of ZnS and ZnSe with a composition ratio of continuously or stepwise varying in the direction of from the interface of the single crystal substrate to the interface of the p-n junction-type epitaxial layer. Precisely, it may be composed of a ZnS-ZnSe epitaxial layer (ZnSSe) in which the atomic composition is same as or extremely similar to that of the single crystal substrate (S=100 to 30 atm. % in S+Se=100 atm. %) in the vicinity of the interface of the said single crystal substrate but the atomic composition is same as or extremely similar to that of the p-n junction-type epitaxial layer (S=0 to 20 atm. % in S+Se=100 atm. %) in the vicinity of the interface of the said p-n junction-type epitaxial layer.

Alternatively, the interlayer may be composed of an epitaxial layer having a so-called super-lattice structure in which a plurality of ZnSSe films are integrated by hetero-junction. The epitaxial layer having such a superlattice structure may be formed, for example, by the use of an MBE-growing device in which Zn-molecular beam and S-molecular or Se-molecular beam are applied alternately or in a determined cycle thereby to grow the respective single atomic layers to a multi-layer as integrated by hetero-junction.

Also in such a super-lattice structure-having epitaxial layer, the lamination density of the ZnS films and the ZnSe film (or the ratio of the number of the ZnS films to the ZnSe films per a certain unit thickness) is desirably varied in the direction of the thickness of the layer, thereby to favorably give a super-lattice epitaxial layer having a ZnS-rich composition in the side of the substrate and a ZnSe-rich composition in the side of the p-n junction-type epitaxial layer. That is, a super-lattice epitaxial layer having a substantially continuously varying composition may desirably be formed, accordingly.

Such a super-lattice epitaxial layer composed of ZnS and ZnSe is preferably formed by laminating the respective ZnS film and ZnSe film each having generally a thickness of from 10 to 200 A alternately or in a determined cycle into 5 to 100 layers having generally from 0.1 to 1 micron. If the thickness of the respective film is smaller than the defined range, it would be impossible to sufficiently relax the lattice mismatch to be caused by the composition strain. However, if it is larger than the defined range, dislocation would unfavorably occur in the layer. Additionally, the concentration of the impurities is preferably higher within the range of being able to obtain a high crystallinity, since the device resistivity may be lowered. For instance, it is preferably from $10^{17}$ to $10^{19}$ cm$^{-3}$.

The electroluminescent device of the present invention is generally equipped with at least a pair of electrodes for imparting voltage to the above-mentioned p-n junction-type epitaxial layer for light-emission of the layer. The electrodes may be provided, for example, by forming a low-resistivity epitaxial layer between the above-mentioned single crystal substrate and the epitaxial interlayer followed by connecting a negative electrode to the low-resistivity epitaxial layer and connecting a positive electrode to the above-mentioned p-n junction-type epitaxial layer.

The low-resistivity epitaxial layer for forming the negative electrode is provided on the single crystal substrate and is desirably composed of a high-concentration Al-containing n-type ZnS epitaxial conductive layer which contains an impurity Al in a concentration of from $10^{18}$ to $10^{20}$ cm$^{-3}$. In the case, In or Al is plated by vacuum evaporation as an electrode material, whereby a good ohmic electrode may directly be obtained. If the impurity concentration is lower than the above-mentioned range, heat-treatment is effected in a high-purity gas of, for example, H$_2$, N$_2$ or Ar (200° to 500° C., several ten seconds to several minutes) whereby a good ohmic characteristic may be obtained. If, on the other hand, the impurity concentration is higher than the above-mentioned range, crystallinity and transparency would often lower. Addition of the impurity Al in the defined concentration of from $10^{18}$ to $10^{20}$ cm$^{-3}$ to obtain the above-mentioned high-concentration Al-containing n-type epitaxial conductive layer is recommended for obtaining the desired carrier concentration almost corresponding to the amount of Al added with good reproducibility. In case, the resistivity was demonstrated to fall within the range of from $10^{-2}$ to $10^{-3}$ Ωcm. The thickness of the layer is desirably to fall within the range of from 0.5 to 10 microns in order that the resistivity of the current route from the electrode-forming part to the light-emitting part may be sufficiently low. On the n-type ZnS epitaxial conductive layer may be formed a low-concentration Al-containing n-type ZnS epitaxial conductive layer having a lower impurity concentration of from $10^{17}$ to $10^{19}$ cm$^{-3}$ than the former conductive layer. Since the latter low-concentration Al-containing n-type ZnS epitaxial conductive layer has a relatively low impurity concentration, it has a higher crystallinity. Therefore, the layer is effective for forming the epitaxial interlayer composed of ZnS and ZnSe and the p-n junction-type ZnSe epitaxial layer both having a high crystallinity, thereover. The thickness of the layer is desirably larger provided that the device resistivity is not enlarged so much, in order to obtain a sufficient crystallinity. For instance, it is suitably from 0.5 to 5 microns.

The negative electrode may be formed, for example, by plating Al or In by evaporation on the above-mentioned high-concentration Al-containing n-type ZnS epitaxial conductive layer as partly exposed by chemical etching or reactive ion-beam etching.

On the other hand, the positive electrode may be formed by plating Au or an Au-Sb alloy by evaporation on the p-n junction-type epitaxial layer. Where light-emission is to be effected from the side of the positive electrode, the thickness of the positive electrode is preferably thin to fall within the range of from 100 to 700 A in order that the light as emitted may sufficiently transmit therethrough.

In the electroluminescent device of the present invention, the epitaxial interlayer composed of ZnS and ZnSe and having a function of relaxing lattice strain acts to relax the lattice strain which is caused by the mismatch of the thermal expansion coefficient between the single crystal substrate and the p-n junction-type epitaxial layer and by the lattice mismatch therebetween and which causes lowering of the crystallinity of the said p-n junction-type epitaxial layer. Additionally, it also acts to inhibit the substrate-constituting elements or the impurities as contained in the substrate from diffusing into the p-n junction-type epitaxial layer by thermal diffusion.

EXAMPLE

Next, the present invention will be explained in more detail by way of the following examples.

EXAMPLE 1

Figure 1:
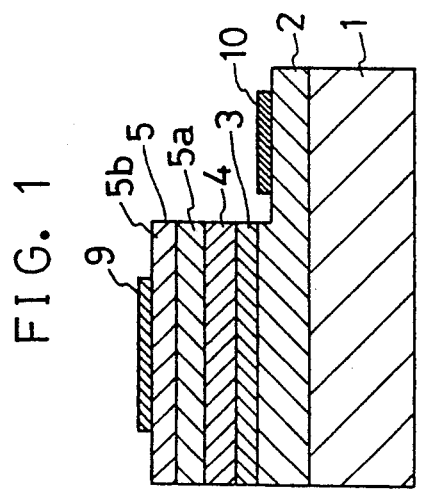

The electroluminescent device of the invention is, as shown in FIG. 1, composed of a ZnS single crystal substrate 1, a high-concentration Al-containing n-type ZnS conductive layer 2, a low-concentration Al-containing n-type ZnS conductive layer 3, an n-type ZnS-ZnSe superlattice layer 4, a ZnSe p-n junction-type epitaxial layer 5 (comprising a ZnSe n-type epitaxial layer 5a and a ZnSe p-type epitaxial layer 5b), a positive electrode 9 and a negative electrode 10.

The ZnS single crystal substrate 1 is an insulating ZnS single crystal substrate, which was formed from a ZnS bulk single crystal as grown by halogen chemical transport process using iodine as a transport medium without any particular treatment for lowering the resistivity. On the ZnS single crystal substrate 1 were epitaxially grown in order the high-concentration Al-containing n-type ZnS epitaxial conductive layer 2 (having Al-concentration of $1 \times 10^{19}$ cm$^{-3}$ and thickness of 0.8 micron), the low-concentration Al-containing n-type ZnS epitaxial conductive layer 3 (having Al-concentration of $1\times10^{18}$ cm$^{-3}$ and thickness of 3 microns), the n-type ZnS-ZnSe super-lattice layer 4 (composed of 40 ZnS layers each having thickness of 25 Å and 40 ZnSe layers each having thickness of 100 Å, the respective layers being alternately laminated, the layer 4 having thickness of 0.5 micron and Al-concentration of $1\times10^{18}$ cm$^{-3}$), the n-type ZnSe epitaxial layer 5a, (having Al-concentration of $5\times10^{16}$ cm$^{-3}$ and thickness of 1.3 microns) and the p-type ZnSe epitaxial layer 5b (having Li-concentration of $1\times10^{16}$ and thickness of 1.1 microns), by MBE process. These epitaxial layers were formed by varying the molecular beam intensity of the source materials as properly selected from Zn, Se, S and impurities Al and Li, while the thickness, composition and impurity concentration of the respective semiconductor layers were severely controlled.

Among these semiconductor layers, the high-concentration Al-containing n-type ZnS epitaxial conductive layer 2 is a high-carrier concentration layer as provided or forming an electrode thereon. Precisely, a part of the epitaxially grown layer was removed by chemical etching and Al is plated on the thus exposed high-concentration Al-containing n-type ZnS epitaxial conductive layer 2 by evaporation to form a good ohmic electrode (negative electrode) thereon. The thickness of the layer 2 was 0.8 micron so that the resistivity in the current route from the electrode part to the light-emitting part could be sufficiently low.

The low-concentration Al-containing n-type ZnS epitaxial conductive layer 3 to be on the high-concentration Al-containing n-type ZnS epitaxial conductive layer 2 is a low-resistivity n-type ZnS layer having an Al-concentration of $1\times10^{18}$ cm$^{-3}$. As the layer 3 has a relatively low impurity-concentration, this has a higher crystallinity. Therefore, the layer 3 was effective for forming the high crystallinity-having n-type ZnS-ZnSe super-lattice epitaxial layer 4 and the p-n junction-type ZnSe epitaxial layer 5 thereon. Au was plated on the p-type ZnSe epitaxial layer 5b of the p-n junction-type ZnSe epitaxial layer 5, in a thickness of 400 Å by evaporation, to form a positive electrode 9 thereon. The positive electrode 9 has a sufficient light-transmittability enough to take out the emitted light from the light-emitting p-n junction-type epitaxial layer 5. Since the thus formed electroluminescent device of compound semiconductor has a p-n junction-type ZnSe epitaxial layer having a high crystallinity, it was observed to emit a sharp blue color of high luminance having a peak near 460 nm. In the constitution of the device, the ZnS single crystal substrate 1 and the high-concentration Al-containing and low-concentration Al-containing n-type ZnS epitaxial conductive layer 2 and 3 are transparent to the emitted blue light, and the n-type ZnS-ZnSe super-lattice layer having the above-defined thickness is to have an absorption edge as shifted to a shorter wavelength side than that of ZnSe by 100 meV because of the quantum effect and additionally, as the thickness of the said superlattice layer is sufficiently small, the layer does almost not absorb the emitted light. Accordingly, the emitted light could efficiently be taken out from the side of the substrate of the device. Where Al was deposited on the back surface of the substrate 1 by evaporation to form a completely reflecting mirror, the emitted light could be efficiently taken out also from the side of the ZnSe p-n junction-type epitaxial layer 5. In the case, the device emitted a light of higher luminance.

EXAMPLE 2

An electroluminescent device was prepared in the same manner as in Example 1, except that an n-type ZnS-ZnS$_x$Se$_{1-x}$ super-lattice layer (where x is suitably from 0.1 to 0.5) was employed in place of the n-type ZnS-ZnSe super-lattice layer 4 in Example 1.

The thus prepared electroluminescent device also had a good p-n junction-type ZnSe epitaxial layer like the device prepared in Example 1. That is, a ZnSe p-n junction-type electroluminescent device of high luminance was realized by the present example.

EXAMPLE 3

An electroluminescent device was prepared in the same manner as in Example 1, except that an n-type ZnS$_x$Se$_{1-x}$-ZnSe super-lattice layer (where x is suitably from 0.5 to 0.9) was employed in place of the n-type ZnS-ZnSe super-lattice layer 4 in Example 1.

The thus prepared electroluminescent device also had a good p-n junction-type ZnSe epitaxial layer like the device prepared in Example 1. That is, an electroluminescent device of compound semiconductor of high luminance was realized by the present example.

EXAMPLE 4

An electroluminescent device was prepared in the same manner as in Example 1, except that the ZnS single crystal substrate 1 and the n-type ZnS epitaxial conductive layers 2 and 3 were made of a mixed crystal of ZnS$_x$Se$_{1-x}$ (where x is from 0.3 to 1 for S-content). The thus prepared electroluminescent device was sufficiently transparent to blue light emission. Accordingly, a high-luminance blue light-emitting electroluminescent device having a high efficiency of taking out the emitted light was realized, like the previous examples.

EXAMPLE 5

Figure 2:
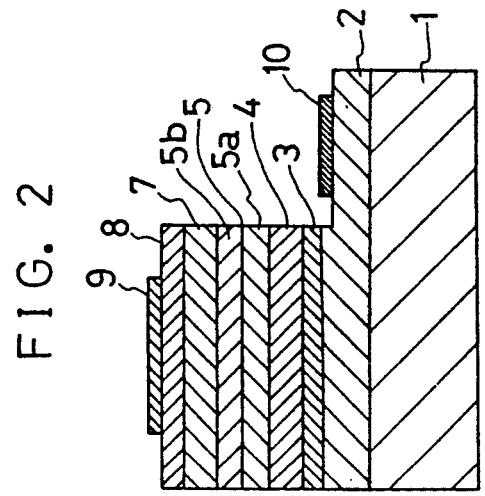

FIG. 2 is a view to typically show the electroluminescent device of compound semiconductor as prepared by the example of the invention. In FIG. 2, the lower part from the p-n junction-type ZnSe epitaxial layer 5 was prepared in the same manner as in Example 1, while a p-type ZnS-ZnSe super-lattice epitaxial layer 7, a p-type ZnS epitaxial conductive layer 8 and a positive electrode 9 were formed in order on the p-n junction-type ZnSe epitaxial layer 5. The methods of forming the semiconductor layer and electrodes, the sizes thereof and the characteristics thereof were same as those in Example 1. The impurities in the p-type ZnS-ZnSe super-lattice epitaxial layer 7 and the p-type ($\pi$-type) ZnS epitaxial conductive layer 8 were same as those in the p-type ZnSe epitaxial layer 5b in Example 1. The p-type ZnS-ZnSe super-lattice epitaxial layer 7 was composed of 40 ZnS layers each having thickness of 25 Å and 40 ZnSe layers each having thickness of 100 Å and had a total thickness of 0.5 micron and a carrier-concentration of $3\times10^{16}$ cm$^{-3}$, like the n-type ZnS-ZnSe super-lattice layer 4 in Example 1. The p-type ($\pi$-type) ZnS epitaxial conductive layer 8 had a carrier concentration of $1\times10^{13}$ cm$^{-3}$ and a layer thickness of 0.05 micron.

In the thus formed electroluminescent device, the p-n junction-type ZnSe epitaxial layer 5 was sandwiched between the n-type and p-type ZnS-ZnSe super-lattice layers 4 and 7, while the carrier was confined in the inside of the p-n junction-type ZnSe epitaxial layer 5 because of the energy barrier formed in both the interfaces. Accordingly, light-emitting efficiency was enlarged, and the device emitted a blue light of higher luminance.

EXAMPLE 6

Figure 3:
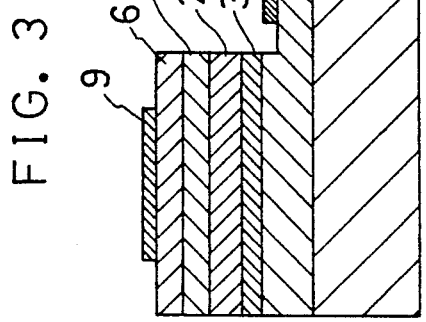
FIG. 1 to FIG. 3 are views each showing the construction of an example of the electroluminescent device of the invention.
Figure 5:
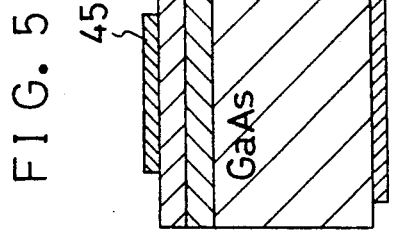

FIG. 3 is a view to typically show the electroluminescent device of compound semiconductor as prepared by the example of the invention. In FIG. 3, the basic constitution of the device was same as that of the electroluminescent device of Example 1, while an n-type $ZnS_xSe_{1-x}$ mixed crystal layer 24 having a composition as substantially continuously varying in the direction of the thickness thereof was provided between the n-type ZnS epitaxial conductive layers 2 and 3 and the p-n junctiontype ZnSe epitaxial layer 5. The n-type $ZnS_xSe_{1-x}$ mixed crystal layer 24 was formed by the use of an MBE growth apparatus where a Zn molecular beam and an S or Se molecular beam were alternately applied to the substrate so that the respective single molecular layers were grown individually. By varying the ratio of the number of irradiation with the S-molecular beam and the Se-molecular beam, or the ratio of the number of ZnS layers to ZnSe layers to be formed per a determined unit thickness, the microscopic average composition of the layer 24 was substantially continuously varied from $x=1$ to $x=0$ from the interface with the n-type ZnS epitaxial conductive layers 2 and 3 to the interface with the p-n junction-type ZnSe epitaxial layer 5. More precisely, the number of ZnS layers and that of ZnSe layers were varied from 29th layer and 1st layer to 1st layer and 29th layer, respectively, through 28th layer and 2nd layer, 27th layer and 3rd layer, . . . in order, to finally form 870 grown layers in all. During the growth procedure, the substrate temperature was 260° C., the Zn-molecular beam pressure was $1\times10^{-6}$ Torr, the S-molecular beam pressure was $5\times10^{-6}$ Torr, the Se-molecular beam pressure was $1\times10^{-6}$ Torr, and the irradiation time for each molecular beam was one second with one-second interval pause at the change of the molecular beam to be applied. After the growth was effected on the (100) face of the substrate under the defined condition, ZnS or ZnSe epitaxial layers corresponding to the numbers of irradiation with the respective molecular beams were stably grown on the said face. Accordingly, the above-mentioned n-type $ZnS_xSe_{1-x}$ mixed crystal layer 24 was formed under good control.

The carrier-concentration of the n-type $ZnS_xSe_{1-x}$ mixed crystal layer 24 is desired to be higher within the range capable of forming a high-crystallinity film, and it was $5\times10^{18}$ cm$^{-3}$ in the example. Al was used as the n-type impurity, and an Al-molecular beam of $7\times10^{-9}$ Torr was applied simultaneously with the Zn-molecular beam in the above-mentioned single atomic layer growth process, for growth of the n-type $ZnS_xSe_{1-x}$ mixed crystal layer 24. The thickness of the layer 24 was about 0.2 micron. In this connection, the thickness thereof is desirably from 0.1 to 1 micron. If it is smaller than the defined range, the composition variation in the n-type $ZnS_xSe_{1-x}$ super-lattice layer 24 would be too sharp to thereby lower the crystallinity of the interlayer 24 itself. However, if it is larger than the same, the resistivity of the device would unfavorably increase.

By providing the $ZnS_xSe_{1-x}$ mixed crystal layer 24 having a continuously varying composition between the n-type ZnS epitaxial conductive layers 2 and 3 and the p-n junction-type ZnSe epitaxial layer 5 on the ZnS single crystal substrate 1, the p-n junction-type ZnSe epitaxial layer 5 could have a high crystallinity, like the case of Example 1. Since the n-type $ZnS_xSe_{1-x}$ mixed crystal layer 24 has a wider gap than the ZnSe of the p-n junction-type ZnSe epitaxial layer of forming the light-emitting layer, it has a sufficiently high light-transmittance to the emitted light. Accordingly, emission of a high-luminance blue light with high efficiency of taking out the emitted light could be realized by the electrophotographic device of the present example, like the device of Example 1.

EXAMPLE 7

In this example, the n-type $ZnS_xSe_{1-x}$ mixed crystal layer 24 of the constitution of the previous example was composed of plural layers each having a stepwise varying composition, while the number of the layers each having a varying composition was sufficiently large, for example, about 5 layers or more. Accordingly, the lattice strain was sufficiently relaxed, and a high-luminance electroluminescent device having the same quality as the device of the previous example was realized.

In the constitution of the electroluminescent device of the present invention, the lattice strain which is caused by the mismatch of the thermal expansion coefficient between the substrate and the p-n junctiontype epitaxial layer and by the lattice mismatch therebetween and which causes lowering of the crystallinity of the p-n junction-type epitaxial layer; one-directional or mutual diffusion of the constitutive elements and added impurities which are different in the respective grown layers is prevented to form a light-emitting layer having a high crystallinity and a high quality with controlled impurities; and a compound semiconductor having a higher band gap and a higher transmittance to the emitted light that the p-n junction-type epitaxial layer may be employed for forming the substrate so that the emitted light may efficiently be taken out of the device. Therefore, in accordance with the present invention, there is provided an electroluminescent device of compound semiconductor having a high luminance and a high efficiency.

A high-luminance electroluminescent device which is prepared by using the basic constitution of the electroluminescent device of compound semiconductor of the present invention (for example, blue light-emitting diode, blue light semiconductor laser, etc.) is extremely useful as a light source for optoelectronics appliances such as various display devices and high information treating layer-combined devices.

What we claim is:

1. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer.

2. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, said epitaxial interlayer having a composition continuously or stepwise varying a composition ratio of ZnS to ZnSe in the direction of from the single crystal substrate to the p-n junction-type epitaxial layer.

3. The device of claim 2 in which the epitaxial interlayer has a composition same as or similar to that of the single crystal substrate and the p-n junction-type epitaxial layer, in the vicinity of the substrate and the epitaxial layer, respectively.

4. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, said epitaxial layer being a super-lattice layer.

5. An electroluminescent device of compound semiconductor which comprises a single crystal substrate made of ZnS or a mixed crystal of ZnS and ZnSe and a p-n junction-type epitaxial layer mode of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, said epitaxial interlayer having a thickness of 0.1 to 1 micron.

6. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, said single crystal substrate having a S content of 30 to 100 atm. % on the total of S plus Se of being 100 atm %.

7. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, said p-n junction-type epitaxial layer being composed of a n-type epitaxial layer and a p-type epitaxial layer.

8. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, at least one low-resistance epitaxial conductive layer being disposed between the single crystal substrate and the epitaxial interlayer.

9. The device of claim 8 in which a negative electrode is formed as being connected to the low-resistance epitaxial conductive layer while a positive electrode is formed on the p-n junction-type epitaxial layer.

10. An electroluminescent device of compound semiconductor which comprises a single crystal substrate made of ZnS or a mixed crystal of ZnS and ZnSe and a p-n junction-type epitaxial layer made of ZnSe or a mixed crystal of ZnS and ZnSe having a composition different from that of the single crystal substrate, the p-n junction-type epitaxial layer being formed over the single crystal substrate through an epitaxial interlayer which is made of ZnS and ZnSe and capable of relaxing the lattice strain between the single crystal substrate and the p-n junction-type epitaxial layer, a super-lattice layer and a low-resistivity epitaxial conductive layer being laminated over the p-n junction-type epitaxial layer.

11. A device as in claim 1 wherein said substrate has a higher S content than said epitaxial layer.

* * * * *